United States Patent
Park et al.

(10) Patent No.: US 9,236,423 B2
(45) Date of Patent: Jan. 12, 2016

(54) ORGANIC LIGHT-EMITTING DISPLAY DEVICE AND METHOD OF MANUFACTURING THE SAME

(75) Inventors: Sun Park, Yongin (KR); Jong-Hyun Park, Yongin (KR); Yul-Kyu Lee, Yongin (KR)

(73) Assignee: Samsung Display Co., Ltd., Giheung-Gu, Yongin-si, Gyeonggi-Do (KR)

( * ) Notice: Subject to any disclaimer, the term of this patent is extended or adjusted under 35 U.S.C. 154(b) by 824 days.

(21) Appl. No.: 13/085,669

(22) Filed: Apr. 13, 2011

(65) Prior Publication Data

US 2012/0074388 A1 Mar. 29, 2012

(30) Foreign Application Priority Data

Sep. 24, 2010 (KR) .................. 10-2010-0092852

(51) Int. Cl.
*H01L 27/32* (2006.01)
*H01L 51/52* (2006.01)

(52) U.S. Cl.
CPC ........ *H01L 27/3262* (2013.01); *H01L 27/3258* (2013.01); *H01L 27/3265* (2013.01); *H01L 51/5265* (2013.01); *H01L 2251/5392* (2013.01)

(58) Field of Classification Search
CPC ............ H01L 27/3258; H01L 27/3262; H01L 27/3265; H01L 2251/5392; H01L 51/5265
USPC .......... 257/40, 13, 84, 85, E33.053, E33.077, 257/E51.001, E51.002, E51.003, E51.004, 257/E51.005, E51.006, E51.007, E51.011, 257/E51.018, E27.119; 438/23
IPC ..................... H01L 27/3258, 27/3262, 27/3265, H01L 2251/5392, 51/5265
See application file for complete search history.

(56) References Cited

U.S. PATENT DOCUMENTS

| 2005/0045882 A1* | 3/2005 | Park et al. .................. 257/59 |
| 2006/0017377 A1 | 1/2006 | Ryu |

(Continued)

FOREIGN PATENT DOCUMENTS

| JP | 2006-269329 | 10/2006 |
| JP | 2006-302748 | 11/2006 |

(Continued)

OTHER PUBLICATIONS

Machine English translation of Korean Patent Document 10-2009-0120698 to Kwon.*
Merriam-Webster OnLine definition of "through."*

*Primary Examiner* — Hrayr A Sayadian
(74) *Attorney, Agent, or Firm* — Robert E. Bushnell, Esq.

(57) ABSTRACT

In an organic light-emitting display device and a method of manufacturing the same, the organic light-emitting display device includes: a first insulating layer, a transparent conductive layer, and a second insulating layer which are sequentially formed on a substrate; a thin film transistor including an active layer formed under the first insulating layer, a gate electrode including a part of the transparent conductive layer as a lower electrode layer, and source and drain electrodes connected to both sides of the active layer; an organic light-emitting device including a sequentially stacked structure comprising a part of the transparent conductive layer as a pixel electrode, an intermediate layer which includes an emission layer, and an opposite electrode; and a capacitor including a first electrode and a second electrode, which includes a part of the transparent conductive layer as a lower electrode layer; wherein the transparent conductive layer and the second insulating layer include a hole.

19 Claims, 9 Drawing Sheets

(56) References Cited

U.S. PATENT DOCUMENTS

| | | | |
|---|---|---|---|
| 2006/0214573 A1 | 9/2006 | Maeda et al. | |
| 2008/0111125 A1* | 5/2008 | Kim et al. | 257/40 |
| 2008/0272685 A1* | 11/2008 | Ikeda et al. | 313/496 |
| 2010/0193790 A1 | 8/2010 | Yeo et al. | |
| 2012/0074388 A1* | 3/2012 | Park et al. | 257/40 |

FOREIGN PATENT DOCUMENTS

| | | | |
|---|---|---|---|
| KR | 10-2004-0098138 | | 11/2004 |
| KR | 10-2006-0007899 | | 1/2006 |
| KR | 10-0943187 | | 2/2010 |
| KR | 10-2010-0088269 | | 8/2010 |
| KR | 10-2012-0031363 | * | 4/2012 |

* cited by examiner

ORGANIC LIGHT-EMITTING DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on Sep. 24, 2010 and there duly assigned Ser. No. 10-2010-0092852.

BACKGROUND OF THE INVENTION

1. Field of the Invention

The present invention relates to an organic light-emitting display device and a method of manufacturing the same, and more particularly, to an organic light-emitting display device which can be fabricated simply and has excellent display characteristics, and a method of manufacturing the same.

2. Description of the Related Art

Organic light-emitting display devices are self-emitting display devices, in which a voltage is applied to a thin film layer, including an anodean anode, a cathode, and an organic emission layer disposed between the anode and the cathode, so that electrons and holes are recombined in the organic emission layer to thereby emit light.

Organic light-emitting display devices have been considered as next generation display devices due to their advantages such as light weight, small thickness, wide viewing angles, fast response speeds, and low power consumption.

On the other hand, organic light-emitting display devices for realizing full-color images adopt an optical resonance structure for changing optical lengths of wavelengths which are emitted from organic emission layers in pixels of different colors (for example, red, green and blue pixels).

SUMMARY OF THE INVENTION

The present invention provides an organic light-emitting display device which can be fabricated simply and has excellent display characteristics, and a method of manufacturing the organic light-emitting display device.

According to an aspect of the present invention, an organic light-emitting display device comprises: a first insulating layer, a transparent conductive layer, and a second insulating layer which are sequentially formed on a substrate; a thin film transistor including an active layer formed under the first insulating layer, a gate electrode including apart of the transparent conductive layer as a lower electrode layer, and source and drain electrodes connected to both sides of the active layer; an organic light-emitting device including a part of the transparent conductive layer as a pixel electrode, and including an intermediate layer, which includes an emission layer, and an opposite electrode which are sequentially stacked; and a capacitor, including a first electrode and a second electrode, which includes a part of the transparent conductive layer as a lower electrode layer, wherein the transparent conductive layer and the second insulating layer comprise a hole.

The transparent conductive layer may be patterned through the hole. The hole may be formed by performing a dry etching process on the second insulating layer, and the transparent conductive layer may be formed by performing a wet etching process on the transparent conductive layer.

The transparent conductive layer may have a structure selected from the group consisting of ITO/Ag/ITO, ITO/Ag/IZO, ATD and ITO/APC/ITO.

The gate electrode and the source and drain electrodes may include a plurality of metal layers. The gate electrode and the source and drain electrodes may include aluminum.

The source and drain electrodes may be respectively connected to source and drain regions via a contact hole formed in the first insulating layer, the transparent conductive layer, and the second insulating layer.

The first electrode may include the same material as the active layer and may be formed on the same layer as the active layer, and the second electrode may include the same material as the source and drain electrodes.

The organic light-emitting display device may further include a pixel defining layer for filling the holes of the transparent conductive layer and the second insulating layer, for exposing a part of the transparent conductive layer as the pixel electrode, and for covering the source and drain electrodes.

According to another aspect of the present invention, a method of manufacturing an organic light-emitting display device comprises: performing a first photomask process to form an active layer of a thin film transistor (TFT) and a first electrode of a capacitor on a substrate having a light-emitting device forming area, a TFT forming area, and a capacitor forming area; performing a second photomask process to deposit a transparent conductive layer on the substrate on which the active layer and the first electrode are formed, and to form a protection layer and a gate electrode on the transparent conductive layer of the light-emitting device forming area and the TFT forming area; respectively: performing a third photomask process to form an interlayer insulating layer which exposes both sides of the active layer, a part of the protection layer, and a part of the transparent conductive layer of the capacitor forming area, and to disconnect the transparent conductive layer; and performing a fourth photomask process to form source and drain electrodes contacting both exposed sides of the active layer and a second electrode of the capacitor, and to remove a part of the protection layer.

The performing of the first photomask process may include: depositing a semiconductor layer on the substrate; and forming the active layer and the first electrode by patterning the semiconductor layer.

The performing of the second photomask process may include: sequentially depositing a first insulating layer, a transparent conductive layer, and a first metal layer on the entire substrate on which the active layer and the first electrode are formed; and forming the protection layer and the gate electrode in the light-emitting device forming area, including the transparent conductive layer as a pixel electrode, and in the TFT forming area including the transparent conductive layer as a lower electrode layer, respectively, by patterning the first metal layer.

The method may further include the step, after performing the second photomask process, of doping the active layer and the first electrode.

The first metal layer may be formed so as to have a multi-layered structure.

The performing of the third photomask process may include: depositing a second insulating layer on the substrate on which the protection layer and the gate electrode are formed; and forming a contact hole for exposing both sides of the active layer, a first opening for exposing a part of the protection layer, a second opening for exposing a part of the transparent conductive layer of the capacitor forming area, and a hole for disconnecting the transparent conductive layer, by patterning the second insulating layer and the transparent conductive layer.

The hole may be formed in boundaries between the light-emitting device forming area and the TFT forming area, and between the TFT forming area and the capacitor forming area.

The second insulating layer may be patterned by dry etching, and the transparent conductive layer may be patterned by wet etching.

The performing of the fourth photomask process may include: depositing a second metal layer on the interlayer insulating layer; and forming the source and drain electrodes and the second electrode, and removing a part of the protection layer, by patterning the second metal layer.

The method may further include performing a fifth photomask process to form a pixel defining layer having a third opening for exposing the transparent conductive layer of the light-emitting device forming area on the substrate on which the source and drain electrodes and the second electrode are formed.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
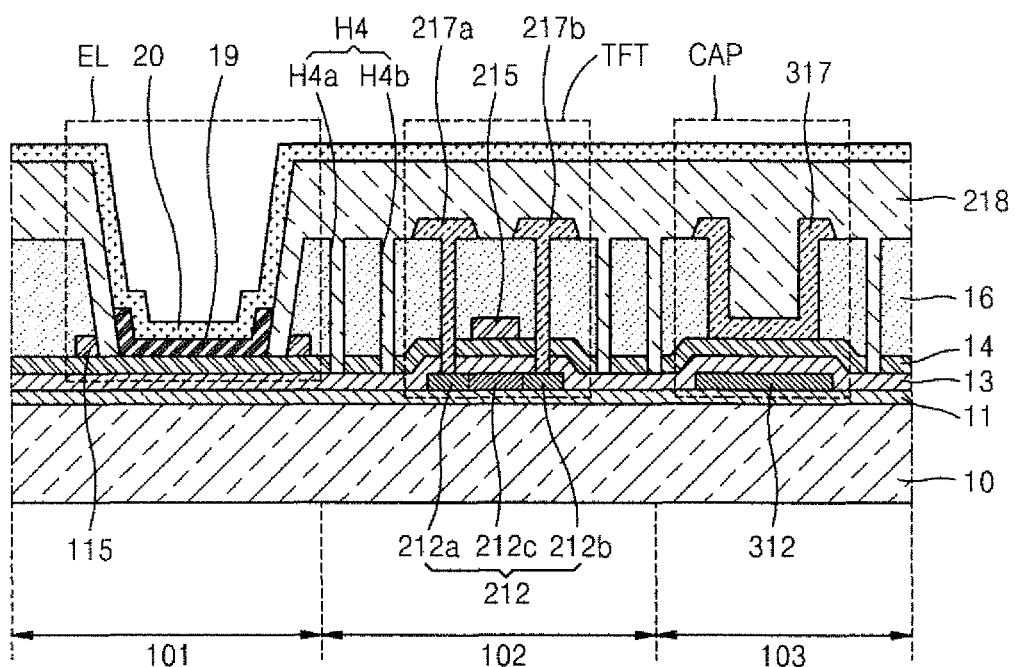
FIG. 1 is a schematic cross-sectional view illustrating a part of an organic light-emitting display device according to an embodiment of the present invention.

Hereinafter, exemplary embodiments of the present invention will be described in detail with reference to the attached drawings. Like reference numerals designate like elements throughout the specification. In the description, the detailed descriptions of well-known functions and structures may be omitted so as not to hinder an understanding of the present invention.

In the drawings, the thicknesses of layers and regions are exaggerated for clarity. Throughout the specification, it will also be understood that, when an element such as layer, region or substrate is referred to as being "on" another element, it can be directly on the other element, or intervening elements may also be present.

FIG. 1 is a schematic cross-sectional view illustrating a part of an organic light-emitting display device according to an embodiment of the present invention.

Referring to FIG. 1, a light-emitting device forming area 101, a thin film transistor (TFT) forming area 102, and a capacitor forming area 103 are defined in the organic light-emitting display device.

A TFT is formed in the TFT forming area 102. The TFT may function as a driving device or a switching device. The TFT includes an active layer 212, a gate electrode 215, and source and drain electrodes 217a and 217b, respectively. A first insulating layer 13 and a transparent conductive layer 14 are interposed between the gate electrode 215 and the active layer 212 so as to insulate the gate electrode 215 from the active layer 212. The transparent conductive layer 14 may function as a lower electrode layer of the gate electrode 215. Source and drain regions 212a and 212b, respectively, into which high concentration impurities are injected, are formed at both sides of the active layer 212, and are connected to the source and drain electrodes 217a and 217b, respectively. A second insulating layer 16 is interposed between the gate electrode 215 and the source and drain electrodes 217a and 217b, respectively.

An organic light-emitting device EL is formed in the light-emitting device forming area 101. The organic light-emitting device EL is electrically connected to the TFT. The organic light-emitting device EL includes a part of the transparent conductive layer 14 as a pixel electrode, includes an opposite electrode 20, and also includes an intermediate layer 19 interposed between the transparent conductive layer 14 and the opposite electrode 20. A pixel defining layer 218 for defining a pixel exposes a part of the transparent conductive layer 14.

A capacitor CAP is formed in the capacitor forming area 103. The capacitor CAP includes a first electrode 312 and a second electrode 317, and the first insulating layer 13 and the transparent conductive layer 14 are interposed between the first electrode 312 and the second electrode 317. The transparent conductive layer 14 may function as a lower electrode layer of the second electrode 317. The first electrode 312 and the active layer 212 are doped at the same time.

The transparent conductive layer 14 is completely formed on a substrate 10 including the light-emitting device forming area 101, the TFT forming area 102, and the capacitor forming area 103. The transparent conductive layer 14 may function as the pixel electrode of the organic light-emitting device EL, as a lower electrode layer of the gate electrode 215 of the TFT, and as the lower electrode layer of the second electrode 317 of the capacitor CAP. The transparent conductive layer 14 and the second insulating layer 16 are patterned together to form short-circuit preventing holes H4 at boundaries, such as between the light-emitting device forming area 101 and the TFT forming area 102, and between the TFT forming area 102 and the capacitor forming area 103.

The organic light-emitting display device of the current embodiment has a metal mirror resonance structure through a five-bottom mask process.

FIGS. 2 thru 16 are schematic cross-sectional views for explaining a method of manufacturing the organic light-emitting display device of FIG. 1 according to an embodiment of the present invention.

Figure 2:
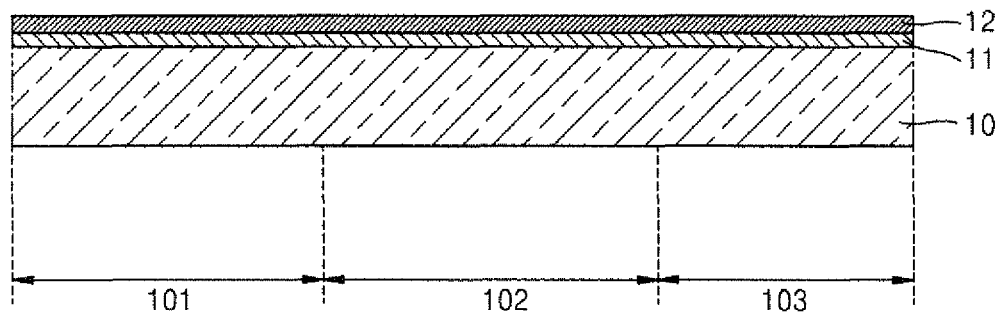
FIGS. 2 thru 16 are schematic cross-sectional views for explaining a method of manufacturing the organic light-emitting display device of FIG. 1.

Referring to FIG. 2, a buffer layer 11 and a semiconductor layer 12 are sequentially formed on the substrate 10.

The substrate 10 may be formed of a transparent glass material, mainly including $SiO_2$. However, the present invention is not limited thereto, and the substrate 10 may be formed of any of various materials, for example, plastic or metals.

The buffer layer 11, including $SiO_2$ and/or SiNx, may be further formed on the substrate 10 in order to maintain the smoothness of the substrate 10 and to prevent impurities from penetrating into the substrate 10.

The semiconductor layer 12 is formed on the buffer layer 11. The semiconductor layer 12 may be formed of amorphous silicon or polycrystalline silicon. The polycrystalline silicon may be obtained by crystallizing the amorphous silicon. The amorphous silicon may be crystallized by using a rapid thermal annealing (RTA) method, a solid phase crystallization (SPC) method, an excimer laser annealing (ELA) method, a metal-induced crystallization (MIC) method, a metal-induced lateral crystallization (MILC) method, or a sequential lateral solidification (SLS) method.

The buffer layer 11 and semiconductor layer 12 may be formed by a deposition method, for example, a plasma-enhanced chemical vapor deposition (PECVD) method, an atmospheric pressure CVD (APCVD) method, or a low-pressure CVD (LPCVD) method, and the buffer layer 11 may be omitted.

Figure 3:
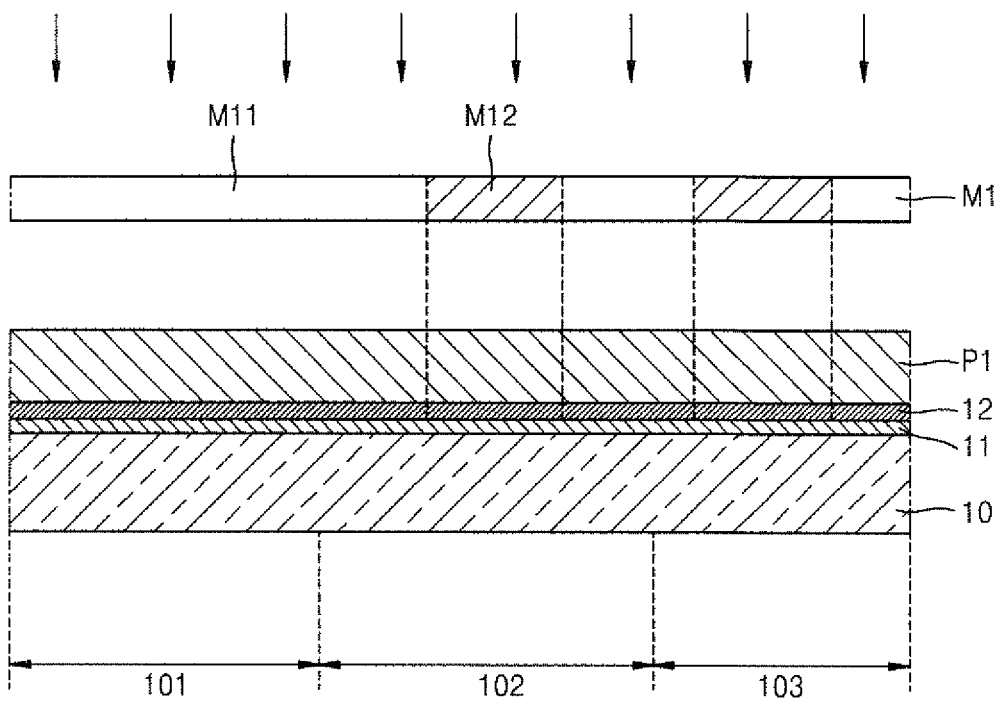

Referring to FIG. 3, a first photoresist P1 is formed on the semiconductor layer 12, and a first photomask process is performed using a first photomask M1, which includes light-transmitting portions M11 and light-shielding portions M12.

Although not shown in the drawings, the stack structure is exposed via the first photomask M1 by using an exposure device (not shown), and then a series of processes, such as developing, etching, and stripping or ashing, are performed.

In the current embodiment, a positive-PR of which a portion exposed by light is removed is used. However, the present invention is not limited thereto, and a negative-PR may be used instead of the positive-PR.

Figure 4:
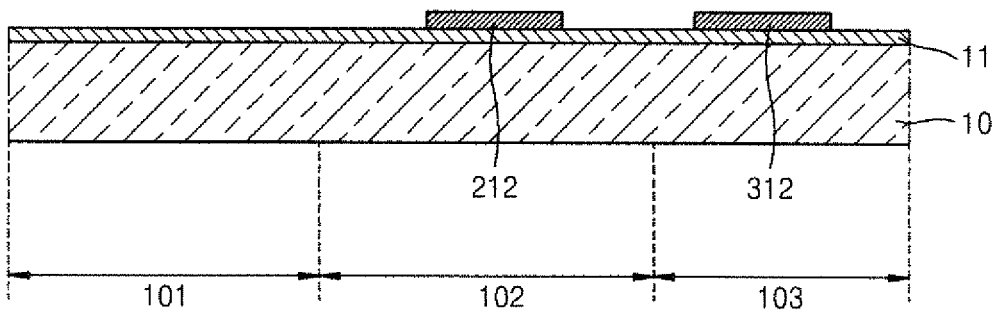

Referring to FIG. 4, the semiconductor layer 12 is patterned into an active layer 212 of a TFT and a first electrode 312 of a capacitor, which is formed of the same material as the active layer 212 and on the same layer as the active layer 212, as a result of the first photomask process.

Figure 5:
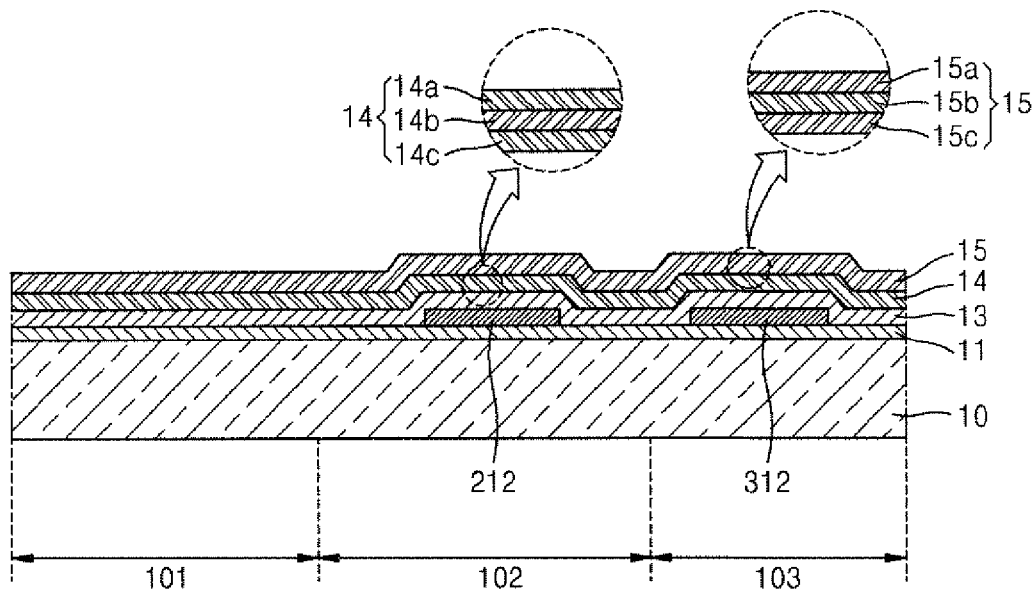

Referring to FIG. 5, the first insulating layer 13, the transparent conductive layer 14, and the first metal layer 15 are sequentially stacked in the stated order on the substrate 10 on which the active layer 212 and the first electrode 312 are formed.

The first insulating layer 13 may be formed by depositing an inorganic material, such as SiOx or SiNx by using a deposition method, for example, a PECVD method, an APCVD method, or an LPCVD method. The first insulating layer 13 may have a single layer structure or a multi-layered structure, and may function as a gate insulating layer of the TFT and an insulating layer of the capacitor.

The transparent conductive layer 14 may be formed of at least one or more selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The transparent conductive layer 14 may have a multi-layered structure, including one or more metals selected from the group consisting of ITO/Ag/ITO, ITO/Ag/IZO, ATD (ITO/Ag alloy/ITO), ITO/APC(Ag—Pd—Cu alloy)/ITO. In the current embodiment, a triple-layered structure of ITO/APC/ITO (that is, layers 14a/14b/14c) is formed. However, the present invention is not limited thereto, and the transparent conductive layer 14 may be formed of any of various materials so as to have any of various multi-layered structures.

The first metal layer 15 may include one or more selected from the group consisting of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). In the current embodiment, the first metal layer 15 includes Al.

In addition, the first metal layer 15 may include a plurality of metal layers 15a, 15b, and 15c and, in the current embodiment, the first metal layer 15 includes a three-layer structure (Mo/Al/Mo). That is, the metal layer 15b is formed of Al and the upper and lower metal layers 15a and 15c, respectively, are each formed of Mo. However, the present invention is not limited to the above example, and the first metal layer 15 may be formed of any of various materials so as to have any of various multi-layered structures.

Figure 6:
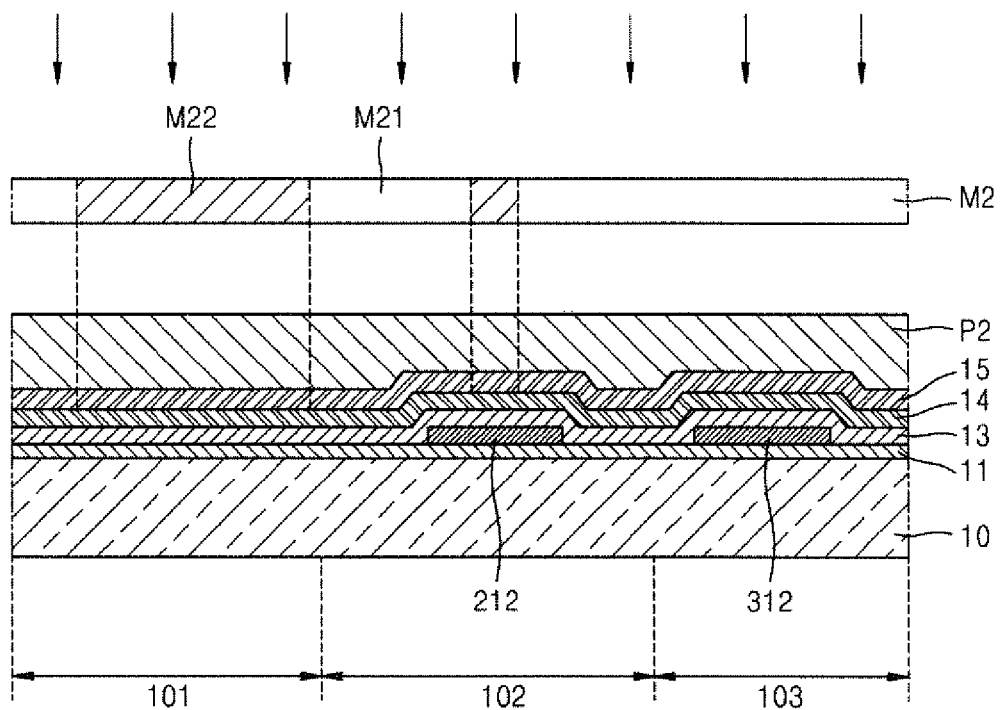

Referring to FIG. 6, a second photosensitive film P2 is applied on the first metal layer 15, and then a second photomask process is performed using a second photomask M2, which includes light-transmitting portions M21 and light-shielding portions M22.

Figure 7:
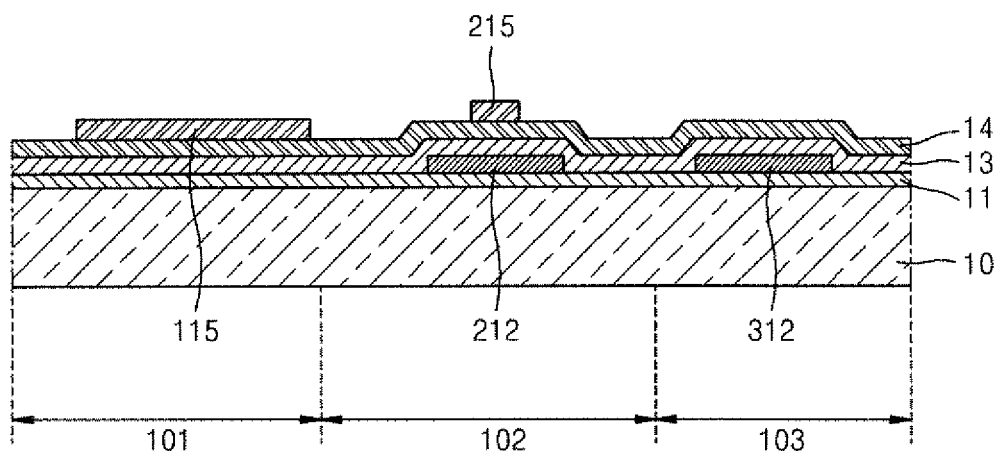

Referring to FIG. 7, as a result of the second photomask process, the first metal layer 15 is patterned into a protection layer 115 of an organic light-emitting device and a gate electrode 215 of the TFT. The gate electrode 215 is formed so as to correspond to a center portion of the active layer 212.

The second photosensitive film P2 does not remain in the capacitor forming area 103 so as to remove the first metal layer 15. Thus, the capacitor may also be doped in a subsequent process for doping a TFT.

Figure 8:
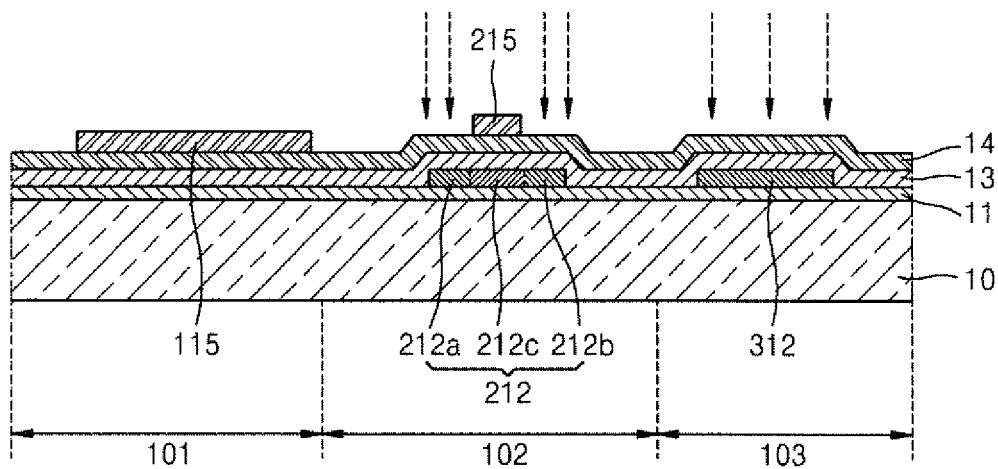

Referring to FIG. 8, the active layer 212 may be doped with ion impurities by using the gate electrode 215 as a self-aligned mask. As a result, the active layer 212 includes source and drain regions 212a and 212b, respectively, doped with ion impurities and a channel region 212c between the source and drain regions 212a and 212b, respectively. That is, since the gate electrode 215 is used as the self-aligned mask, the source and drain regions 212a and 212b, respectively, may be formed without using an additional photomask.

In addition, the first electrode 312 of the capacitor may be doped with ion impurities, when doping the active layer 212, through the transparent conductive layer 14 from which the first metal layer 15 is removed. The doping process of the first electrode 312 may minimize a decrease in a capacity of the capacitor, thereby improving the reliability of a semiconductor device.

The ion impurities injected when doping the active layer 212 may be the same as, or different from, those injected when doping the first electrode 312.

In the current embodiment, a channel and a storage may be formed through a single doping process, thereby reducing a manufacturing time and cost.

Figure 9:
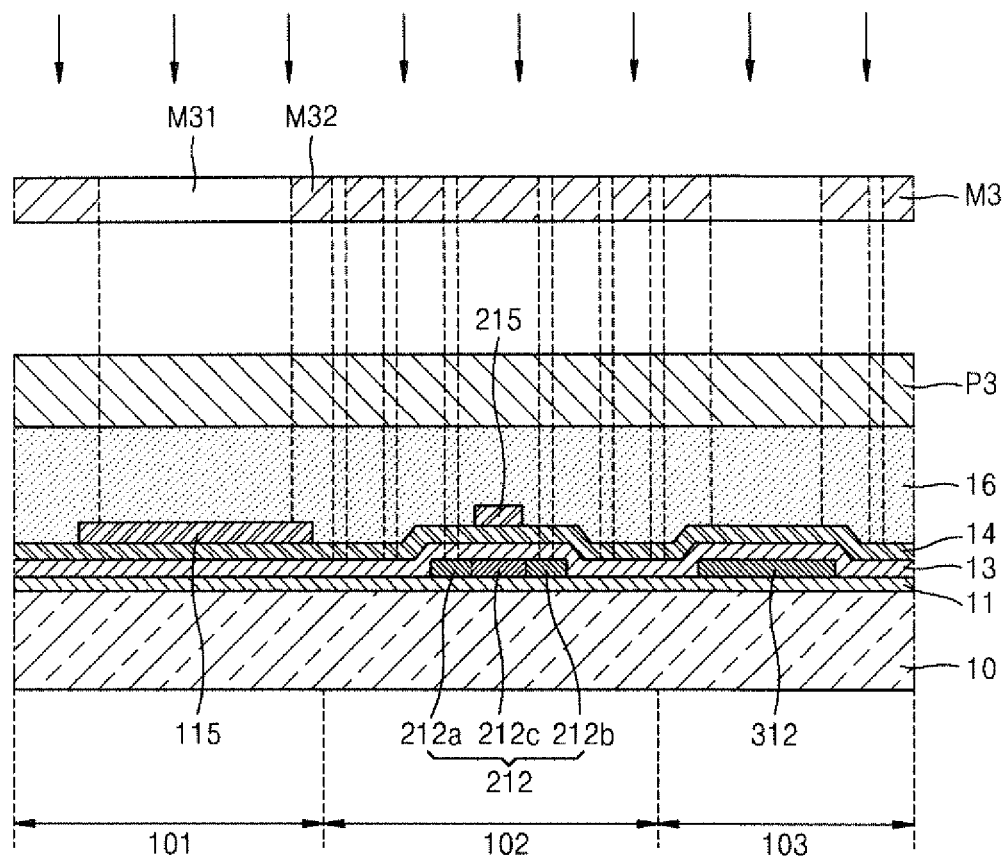

Referring to FIG. 9, the second insulating layer 16 and a third photosensitive film P3 are completely applied on the substrate 10 on which the protection layer 115 and the gate electrode 215 are formed, and then a third photomask process is performed using a third photomask M3, which includes light-transmitting portions M31 and light-shielding portions M32.

The second insulating layer 16 may be formed of one or more organic insulating materials selected from the group consisting of polyimide, polyamide, an acrylic resin, benzocyclobutene, and a phenol resin by using a spin coating method. The second insulating layer 16 may be formed so as to have a sufficient thickness. For example, the second insulating layer 16 may be formed so as to be thicker than the above-described first insulating layer 13 and may function as an interlayer insulating layer between the gate electrode 215 and the source and drain electrodes 217a and 217b, respectively. The second insulating layer 16 may also be formed of an inorganic insulating material selected from the group consisting of $SiO_2$, SiNx, $Al_2O_3$, CuOx, $Tb_4O_7$, $Y_2O_3$, $Nb_2O_5$, and $Pr_2O_3$. Alternatively, the second insulating layer 16 may be formed by alternately stacking the organic insulating material and the inorganic insulating material.

Figure 10:
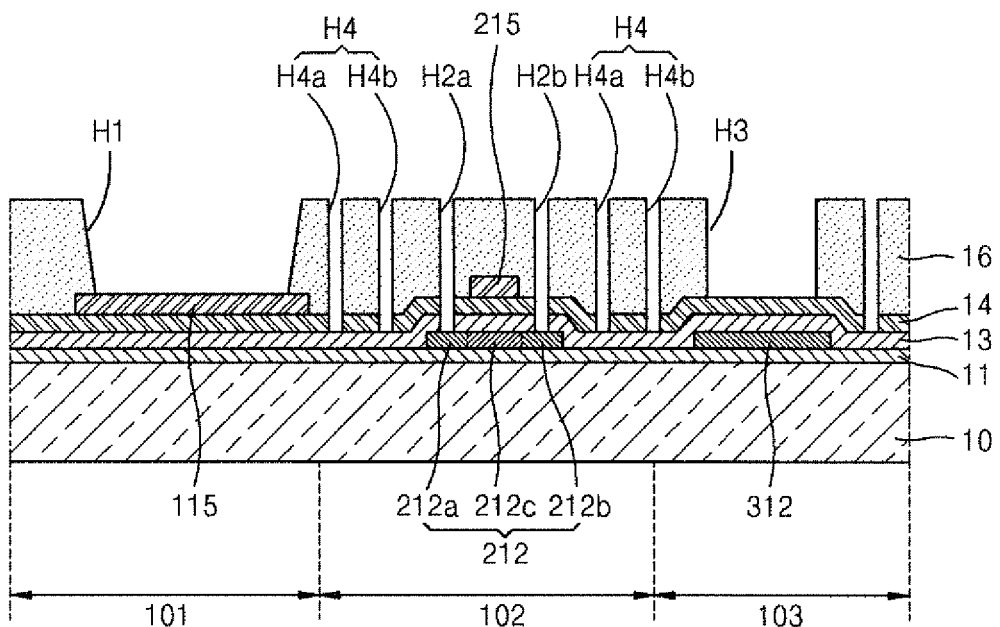

Referring to FIG. 10, as a result of the third photomask process, a first opening H1 for exposing the protection layer 115, contact holes H2a and H2b for exposing the source and drain regions 212a and 212b, respectively, of the TFT, and a second opening H3 for exposing the transparent conductive layer 14 of the capacitor forming area 103 may be formed in the second insulating layer 16.

In the current embodiment, a process for patterning the transparent conductive layer 14 is not additionally performed to form a pixel electrode of the light-emitting device forming area 101. Accordingly, a process for preventing a short circuit due to the transparent conductive layer 14 is necessary.

In the current embodiment, a hole for disconnecting the transparent conductive layer 14 is formed in the boundaries, such as between the light-emitting device forming area 101 and the TFT forming area 102, and between the TFT forming area 102 and the capacitor forming area 103. That is, short-circuit preventing holes H4 for preventing the transparent conductive layer 14 from being short-circuited are formed. The transparent conductive layer 14 may be patterned through the short-circuit preventing holes H4, and an etchant may permeate into the transparent conductive layer 14 through the short-circuit preventing holes H4. The short-circuit preventing hole H4 may be formed by removing the second insulating layer 16 through dry etching and removing the transparent conductive layer 14 through wet etching. The first insulating layer 13 is exposed through the short-circuit preventing hole H4 by etching the transparent conductive layer 14 and the second insulating layer 16. In addition, though not shown, the buffer layer 11 may be exposed through the short-circuit preventing hole H4 by etching even the first insulating layer 13 in the third photomask process.

In the current embodiment, two short-circuit preventing holes H4a and H4b are formed so as to surely prevent the transparent conductive layer 14 from being short-circuited. However, the present invention is not limited thereto, and only one short-circuit preventing hole or more than three short-circuit preventing holes may be formed in each of the boundaries between the light-emitting device forming area 101 and the TFT forming area 102 and between the TFT forming area 102 and the capacitor forming area 103.

Figure 11:
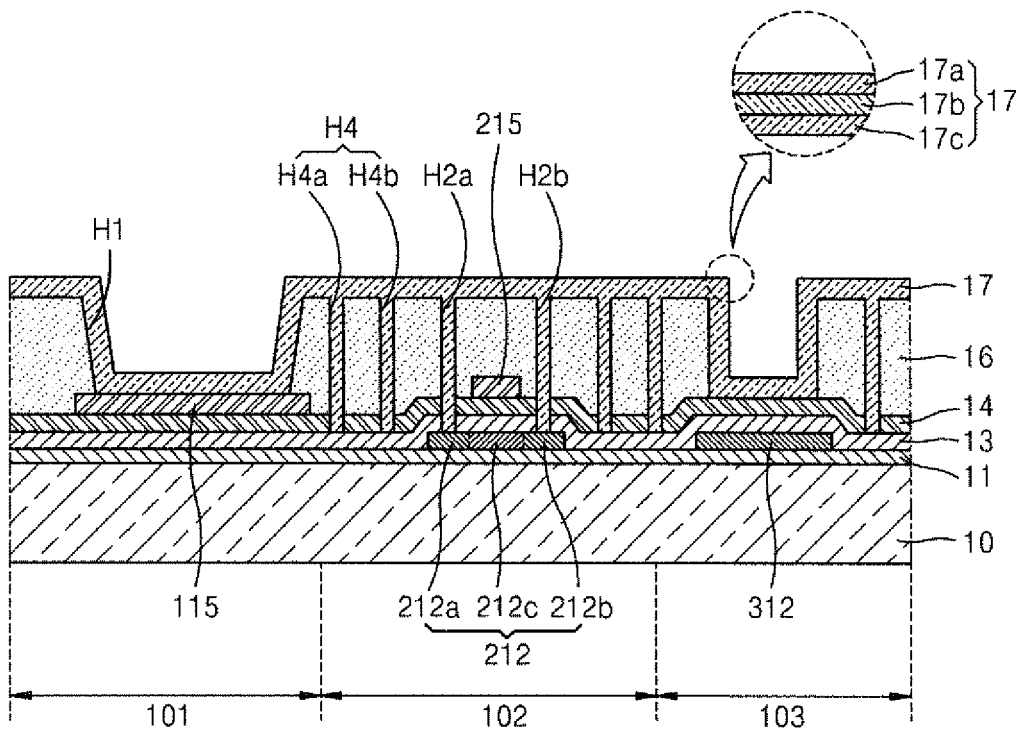

Referring to FIG. 11, a second metal layer 17 is formed on the structure of FIG. 10.

The second metal layer 17 fills the first opening H1, the contact holes H2a and H2b, the second opening H3, and the short-circuit preventing holes H4a and H4b.

The second metal layer 17 may include one or more metals selected from the group consisting of Al, Pt, Pd, Ag, Mg, Au, Ni, Nd, Ir, Cr, Li, Ca, Mo, Ti, W, and Cu. In the current embodiment, the second metal layer 17 may include Al, similar to the first metal layer 15.

In addition, the second metal layer 17 may include a plurality of metal layers 17a, 17b, and 17c and, in the current embodiment, the second metal layer 17 includes a three-layer structure (Ti/Al/Ti). That is, the metal layer 17b is formed of Al and the upper and lower metal layers 17a and 17c, respectively, are each formed of Ti. However, the present invention is not limited thereto, and the second metal layer 17 may include various materials and various layers.

Figure 12:
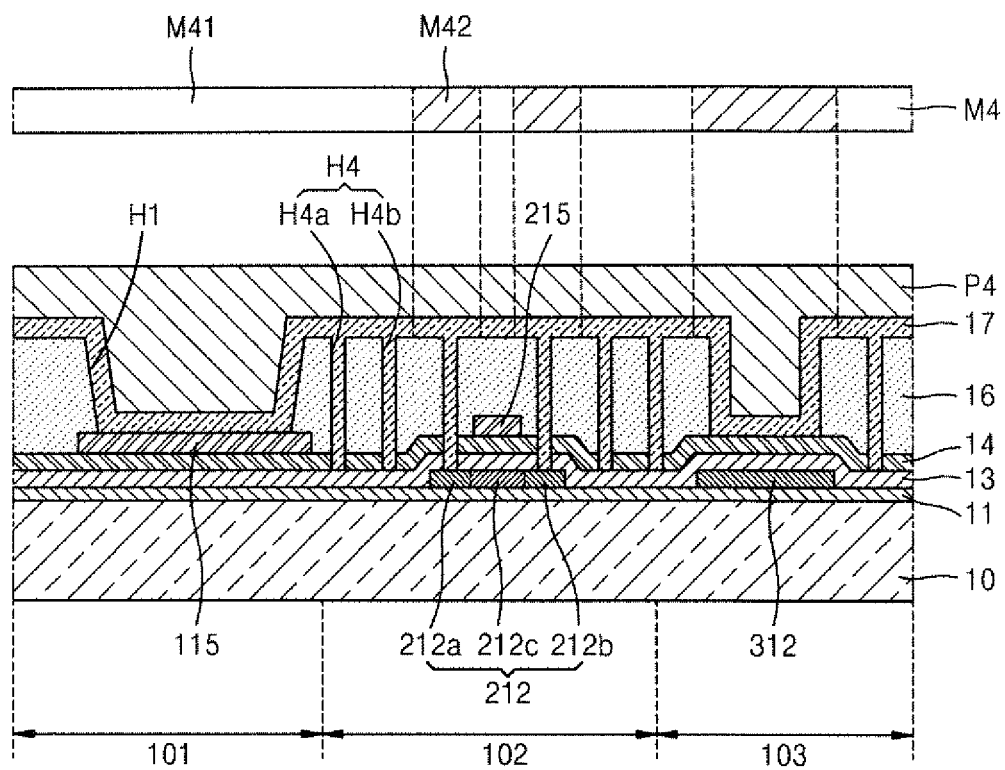

Referring to FIG. 12, a fourth photosensitive film P4 is applied on the second metal layer 17, and then a fourth photomask process is performed using a fourth photomask M4, which includes light-transmitting portions M41 and light-shielding portions M42.

Figure 13:
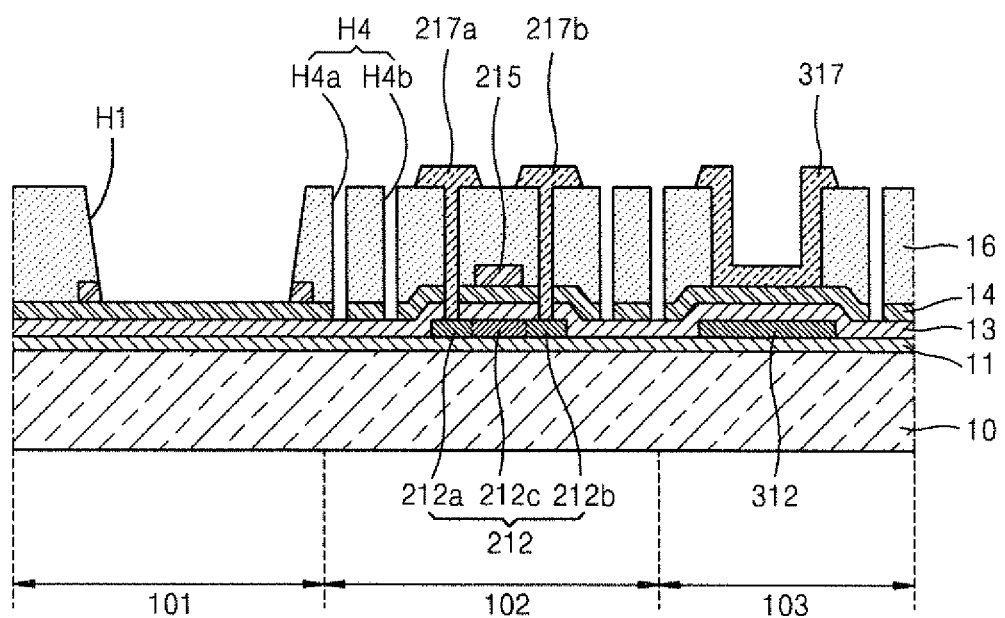

Referring to FIG. 13, the source and drain electrodes 217a and 217b, respectively, electrically connected to the source and drain regions 212a and 212b, respectively, are formed in the TFT forming area 102. The second electrode 317 of the capacitor is formed in the capacitor forming area 103. The transparent conductive layer 14 is disposed under the second electrode 317, and thus the transparent conductive layer 14 functions as a lower electrode layer.

The second metal layer 17 and the protection layer 115, formed in the first opening H1 of the light-emitting device forming area 101, are removed. Thus, the transparent conductive layer 14 of the light-emitting device forming area 101 is exposed, and the exposed transparent conductive layer 14 functions as a pixel electrode.

The second metal layer 17, formed in the plurality of short-circuit preventing holes H4a and H4b formed in each of the boundaries between the light-emitting device forming area 101 and the TFT forming area 102, and between the TFT forming area 102 and the capacitor forming area 103, is also removed.

Figure 14:
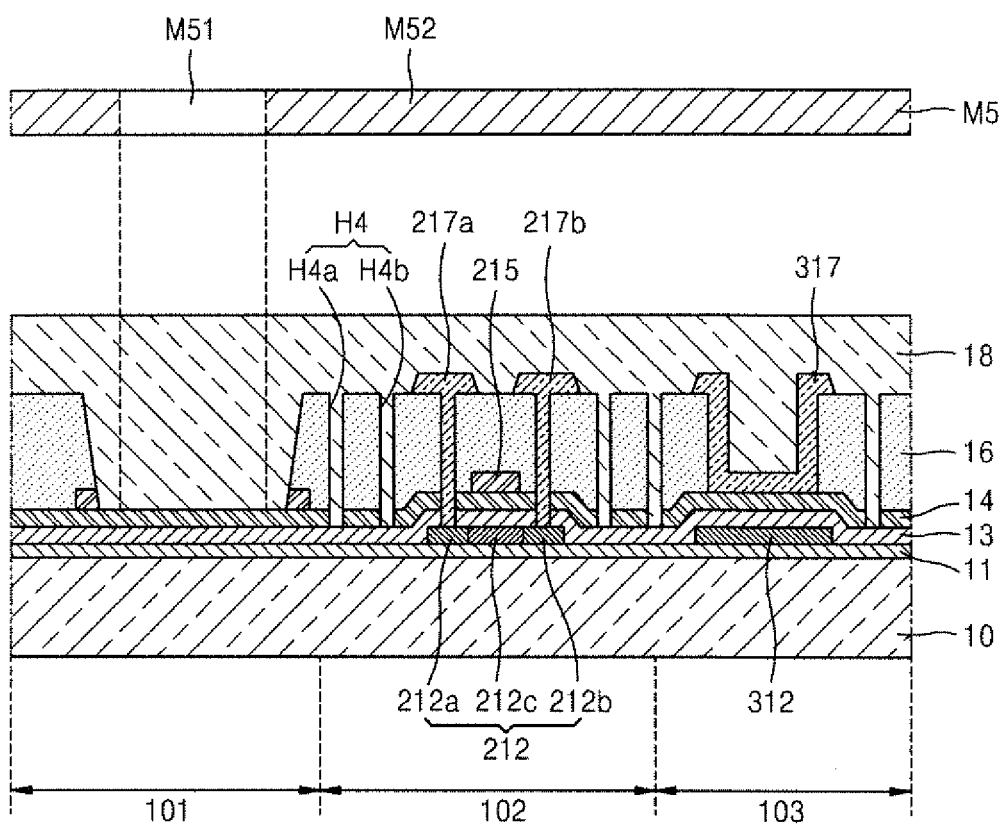

Referring to FIG. 14, a third insulating layer 18 is completely applied on the substrate 10 on which the source and drain electrodes 217a and 217b, respectively, and the second electrode 317 are formed, and then a fifth photomask process is performed using a fifth photomask M5, which includes light-transmitting portions M51 and light-shielding portions M52.

The third insulating layer 18 may be formed of one or more organic insulating materials selected from the group consisting of polyimide, polyamide, an acrylic resin, benzocyclobutene, and a phenol resin by using a spin coating method. The third insulating layer 18 may also be formed of an inorganic insulating material selected from the group consisting of $SiO_2$, SiNx, $Al_2O_3$, CuOx, $Tb_4O_7$, $Y_2O_3$, $Nb_2O_5$, and $Pr_2O_3$. Alternatively, the third insulating layer 18 may be formed by alternately stacking the organic insulating material and the inorganic insulating material.

Figure 15:
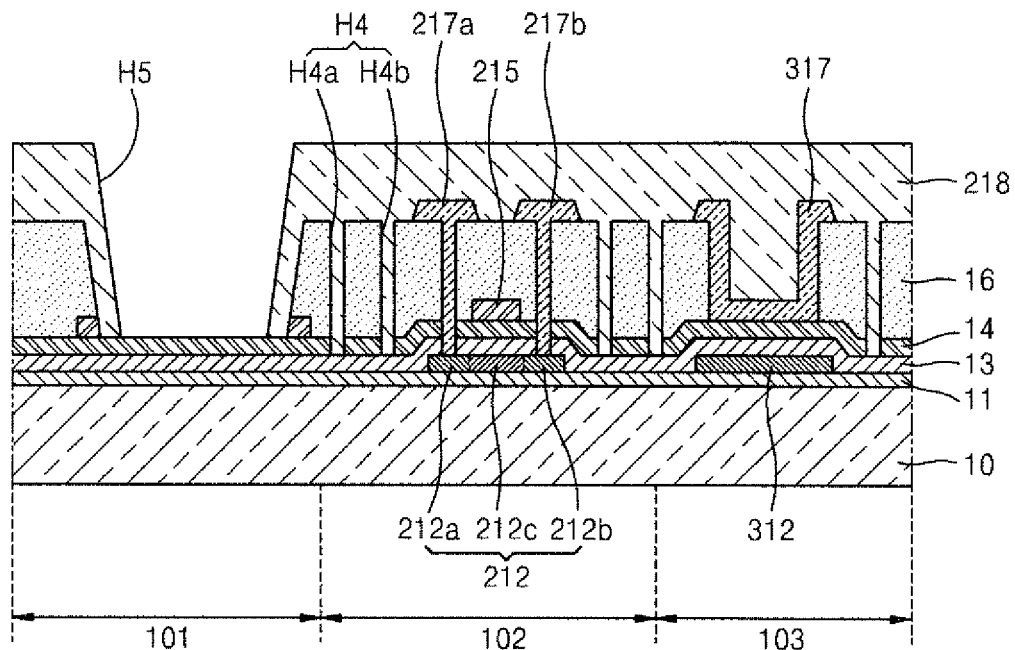

Referring to FIG. 15, as a result of the fifth photomask process, a third opening H5 is formed by patterning the third insulating layer 18 so as to expose a center portion of the transparent conductive layer 14 of the light-emitting device forming area 101, thereby forming the pixel defining layer 218 for defining the pixel.

Figure 16:
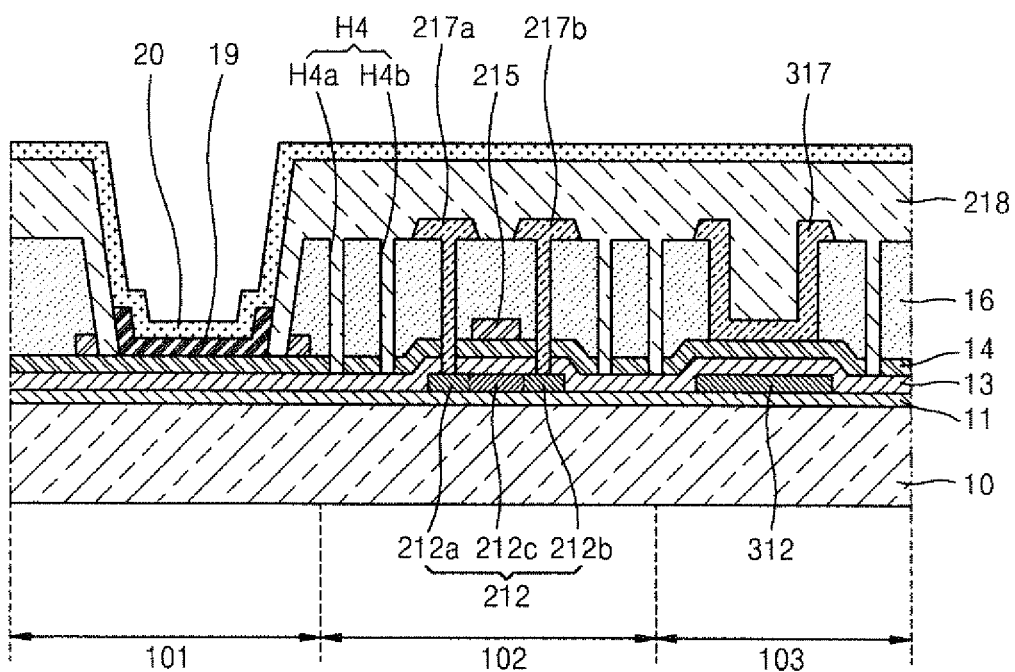

Referring to FIG. 16, the intermediate layer 19, including an emission layer, and the opposite electrode 20 are formed in the third opening H5.

The intermediate layer 19 may be formed of a low-molecular weight organic material or a high-molecular weight organic material.

When the intermediate layer 19 is formed of a low-molecular weight organic material, the intermediate layer 19 includes a hole transport layer and a hole injection layer which are stacked from the emission layer toward the substrate 10, and includes an electron transport layer and an electron injection layer which are stacked from the emission layer toward the opposite electrode 20. Moreover, the intermediate layer 19 may include other various layers stacked when necessary. In this case, the organic material may be copper phthalocyanine (CuPc), N,N'-Di(naphthalene-1-yl)-N,N'-diphenyl-benzidine (NPB), tris-8-hydroxyquinoline aluminum (Alq3), or the like.

When the intermediate layer 19 is formed of a high-molecular weight organic material, the intermediate layer 19 may include only a hole transport layer formed from the emission layer toward the substrate 10. The hole transport layer may be formed in the third opening H5 by ink-jet printing or spin coating using poly-2,4-ethylene-dihydroxy thiophene (PEDOT) or polyaniline (PANI). In this case, the organic material may be a Poly-Phenylenevinylene (PPV)-based high-molecular weight organic material or a Polyfluorene-based high-molecular weight organic material, and a color pattern may be formed by using a conventional method, such as a thermal imprint method using ink-jet printing, spin coating, or laser.

The opposite electrode 20 is completely applied on the substrate 10 so as to be formed as a common electrode. In the organic light-emitting display device of the current embodiment, the transparent conductive layer 14 exposed by the third opening H5 is used as an anode, and the opposite electrode 20 is used as a cathode. The polarities of the electrodes may be inverted.

When the organic light-emitting display device is a bottom emission type display in which an image is displayed toward the substrate 10, the opposite electrode 20 may be a reflective electrode. In this case, the reflective electrode maybe formed by thinly depositing a metal having a low-work function and selected from the group consisting of, for example, Ag, Mg, Al, Pt, Pd, Au, Ni, Nd, Ir, Cr, Li, Ca, LiF/Ca, and LiF/Al, or a combination thereof.

On the other hand, although not shown in the drawings, a sealing member or a moisture absorbent for protecting the organic light-emitting display device from external moisture or oxygen may be further formed on the opposite electrode 20.

According to the present invention, a channel and a storage may be formed through a single doping process, thereby reducing the manufacturing cost.

Also, a short-circuit preventing hole is formed in a transparent conductive layer without additionally patterning the transparent conductive layer, which is a pixel electrode, and thus an organic light-emitting display device having a resonance structure using a metal mirror may be manufactured, thereby reducing the manufacturing time and cost.

Thus, the present invention provides an organic light-emitting display device which can be fabricated simply, and which has excellent display characteristics.

While the present invention has been particularly shown and described with reference to exemplary embodiments thereof, it will be understood by those of ordinary skill in the art that various changes in form and detail maybe made therein without departing from the spirit and scope of the present invention, as defined by the following claims.

What is claimed is:

1. An organic light-emitting display device, comprising:
    an active layer of a thin film transistor (TFT) in a TFT forming area on a substrate and a first electrode of a capacitor in a capacitor forming area on the substrate;
    a first insulating layer on the substrate on which the active layer and the first electrode are formed;
    a transparent conductive layer on the substrate upon which the first insulating layer is formed;
    a gate electrode contacting the transparent conductive layer in the TFT forming area;
    a second insulating layer on the substrate on which the gate electrode is formed;
    a plurality of holes through both the transparent conductive layer and the second insulting layer;
    source and drain electrodes contacting both sides of the active layer via the holes; and
    a second electrode of the capacitor contacting the transparent conductive layer in the capacitor forming area.

2. The organic light emitting display device of claim 1, wherein the transparent conductive layer comprises
    a first part of the transparent conductive layer as a lower electrode layer of the gate electrode,
    a second part of the transparent conductive layer as a pixel electrode, and
    a third part of the transparent conductive layer as a lower electrode layer of the second electrode of the capacitor.

3. The organic light emitting display device of claim 1, the both sides of the active layer and the first electrode are doped.

4. The organic light emitting display device of claim 1, the transparent conductive layer having a multi-layered structure.

5. The organic light emitting display device of claim 1, wherein the holes are located in boundaries between the light-emitting device forming area and the TFT forming area, and between the TFT forming area and the capacitor forming area.

6. The organic light emitting display device of claim 1, wherein the holes are formed by patterning the second insulating layer by dry etching, and by patterning the transparent conductive layer by wet etching.

7. The organic light emitting display device of claim 1, wherein the holes are further extended to the first insulating layer.

8. The organic light emitting display device of claim 2, further comprising a pixel defining layer contacting a part of the pixel electrode and exposing a center portion of the pixel electrode.

9. An organic light-emitting display device, comprising:
    a first insulating layer, a transparent conductive layer, and a second insulating layer sequentially formed on a substrate;
    a thin film transistor including an active layer formed under the first insulating layer, a gate electrode comprising a first part of the transparent conductive layer serving as a lower electrode layer of the gate electrode, and source and drain electrodes connected to the active layer;
    an organic light-emitting device including a sequentially stacked structure comprising a pixel electrode which comprises a second part of the transparent conductive layer, an intermediate layer which comprises an emission layer, and an opposite electrode;
    a capacitor including a first electrode, and a second electrode which comprises a third part of the transparent conductive layer serving as a lower electrode layer of the second electrode;
    a plurality of holes through both the transparent conductive layer and the second insulting layer.

10. The organic light-emitting display device of claim 9, the transparent conductive layer is patterned through the holes.

11. The organic light-emitting display device of claim 9, wherein the holes are formed by a dry etching process on the second insulating layer, and by a wet etching process on the transparent conductive layer.

12. The organic light-emitting display device of claim 9, wherein the transparent conductive layer has a structure selected from the group consisting of ITO/Ag/ITO, ITO/Ag/IZO, ATD, and ITO/APC/ITO.

13. The organic light-emitting display device of claim 9, wherein the gate electrode and the source and drain electrodes comprise a plurality of metal layers.

14. The organic light-emitting display device of claim 13, wherein the gate electrode and the source and drain electrodes comprise aluminum.

15. The organic light-emitting display device of claim 9, the source and drain electrodes are connected to source and drain regions of the active layer, respectively, via contact holes formed through the first insulating layer, the transparent conductive layer, and the second insulating layer.

16. The organic light-emitting display device of claim 9, wherein the first electrode comprises a same material as the active layer and is formed on a same layer as the active layer, and the second electrode comprises a same material as the source and drain electrodes.

17. The organic light-emitting display device of claim 9, further comprising a pixel defining layer filling the holes of the transparent conductive layer and the holes of the second insulating layer, exposing the second part of the transparent conductive layer of the pixel electrode, and covering the source and drain electrodes.

18. The organic light-emitting display device of claim 9, wherein the holes are located in boundaries between the organic light-emitting device and the thin film transistor, and between the thin film transistor and the capacitor.

19. The organic light-emitting display device of claim 9, the transparent conductive layer having a multi-layered structure.

* * * * *